United States Patent [19]

Laurence

[11] Patent Number: 4,517,415
[45] Date of Patent: May 14, 1985

[54] HEARING AIDS

[75] Inventor: Roger F. Laurence, Camberley, England

[73] Assignee: Reynolds & Laurence Industries Limited, Channel Islands

[21] Appl. No.: 435,870

[22] Filed: Oct. 20, 1982

[30] Foreign Application Priority Data

Oct. 20, 1981 [GB] United Kingdom ............... 8131600

[51] Int. Cl.³ .............................................. H04R 27/02
[52] U.S. Cl. ................................ 179/107 FD; 381/68
[58] Field of Search .................... 179/107 FD, 107 R; 381/68

[56] References Cited

U.S. PATENT DOCUMENTS 3,818,149  6/1974  Stearns ........................ 179/107 FD
3,894,195  7/1975  Kryter ......................... 179/107 FD

FOREIGN PATENT DOCUMENTS 2316939  4/1973  Fed. Rep. of Germany ...... 179/107
2613513  6/1977  Fed. Rep. of Germany ...... 179/107 FD
3027953  2/1982  Fed. Rep. of Germany ...... 179/107 FD
3027952  2/1982  Fed. Rep. of Germany ... 179/107 R
1506295  4/1978  United Kingdom ......... 179/107 FD

OTHER PUBLICATIONS

E. Villchur, "Signal Processing . . . ", *Journal of the Acoustical Society of America*, vol. 53, No. 6, pp. 1646-1657.
IEEE Transactions on Acoustics, Speech and Signal Processing, vol. ASP24, No. 6, Dec. 1976, pp. 507-511, New York; P. Yanick et al., "Signal Processing to Improve Intelligibility in the Presence of Noise for Persons with a Ski-Slope Hearing Impairment.

*Primary Examiner*—Gene Z. Rubinson
*Assistant Examiner*—L. C. Schroeder
*Attorney, Agent, or Firm*—Nolte, Nolte and Hunter

[57] ABSTRACT

A hearing aid comprising a microphone whose output signal is split by high and low pass filters and supplied to two channels. Each channel includes a variable gain circuit the outputs of which are mixed and supplied to an earphone. The turnover frequencies of the filters are such that one channel limits the dynamic range of vowels whereas the other channel limits the dynamic range of consonents, thus preventing interaction and masking of consonants by preceding vowels. The intelligibility of speech is thus improved.

10 Claims, 7 Drawing Figures

HEARING AIDS

BACKGROUND OF THE INVENTION

1. Field of Invention

The present invention relates to hearing aids.

FIG. 1 of the accompanying drawings shows the frequency and intensity of distribution of speech sounds, which approximately occupy an intensity range of 25 dB. In normal working and social lives, peak speech levels of 55 to 85 dB are commonly encountered. Thus the total dynamic range of speech to be perceived is 85-(55-25) or 55 dB.

A large proportion of bearing-impaired people have tone audiograms in which the threshold of hearing is elevated and the threshold of discomfort remains the same as that for a healthy ear. Thus the dynamic range is reduced. Dynamic ranges of 40 to 20 dB are not uncommon over some part of the frequency spectrum. The threshold of hearing is often more elevated over some parts of the spectrum than others.

2. Description of the Prior Art

Hearing aids have been made in which automatic gain (AGC) with a short attack time and a long release time has been used. This suffers from the disadvantage that vowels are more powerful than consonants while most of the information in speech is contained in the relatively weak consonants. A loud vowel causes the AGC system to reduce gain and the following weak consonant is below the threshold of hearing.

The threshold of hearing is usually not at a constant level with frequency and tone control is needed to enable all weak signals needed to be heard. On the other hand the threshold of discomfort is usually fairly constant with frequency and loud signals should be limited to a fairly constant level at the eardrum e.g. 90 dB SPL for many patients. However, a change of 10 dB with frequency in the level of the threshold of discomfort may occur and, if it rises in a part of the spectrum where the threshold of hearing is also very elevated, it may be advisable to limit sounds 10 dB higher in the raised part of the threshold of discomfort.

Thus, it is desirable to provide a hearing aid system with tone control and signal limitation. However, the system should otherwise deliver the sound without amplitude or frequency distortion. For a patient with binaural capability, an aid on each ear will make speech easier to understand, particularly in conditions of competing noise.

Multi-channel compressor hearing aid systems are known in which the channel amplifiers are set to different compression ratios for each channel. However in such systems, the speech envelope is impaired.

SUMMARY OF THE INVENTION

According to the invention, there is provided a hearing aid, comprising a first electro-acoustic transducer for converting sound to an electrical signal; frequency dependent filtering means for dividing the electrical signal from the first transducer into two signals of different frequency bands; two channels each comprising a variable gain circuit arranged to reduce the dynamic range of the signals from the filtering means which comprise a high pass filter and a low pass filter in first and second ones, respectively, of the two channels, the filters having substantially the same turnover frequency which is in the range 1000 to 2000 Hz; means for mixing the outputs of the channels; and a second electro-acoustic transducer for converting the output of the mixing means to an acoustic signal; the variable gain circuits being arranged such that above a predetermined threshold the peak output is substantially constant without the signals suffering distortion.

Thus, the channels contain amplifiers which work at full gain until a certain peak signal voltage is reached. Thereafter the peak signal voltage is maintained substantially constant, but without introducing any substantial distortion.

Using two channel means that tone control can be achieved by making the gain before limiting starts adequate to raise weak speech sounds above the threshold of hearing. For loud signals, limitation can be made to occur always at the same intensity to suit a flat threshold of discomfort curve.

The high pass and low pass filters have the same turnover frequency and preferably this is equal to approximately 1500 Hz. It is also preferred that the filters have similar filtering characteristics i.e. the same shape and order.

If 1500 Hz is chosen as the cross-over frequency, loud long vowels containing little information pass through the low frequency channel and soft short consonants containing information pass through the high frequency channel. Multi-channel systems are known but such known systems tend to lose the envelope shapes and formant characteristics of speech.

Preferably, each variable gain circuit comprises a variable gain amplifier and an envelope detector whose input is connected to the output of the variable gain amplifier and whose output is connected to a gain control input of the variable gain amplifier. The envelope detector is arranged to respond to envelopes whose amplitude exceeds a predetermined value. The variable gain amplifier and envelope detector thus perform limiting preferably with an attack time of approximately 2 milliseconds and a release time between 10 and 50 milliseconds. An adjustable attenuator may be provided between the input of each variable gain amplifier and the output of the corresponding filter to allow adjustment of dynamic range for each channel. An adjustable attenuator may be provided between the output of each variable gain amplifier and the mixing means to permit the relative levels of signals in the different frequency bands to be adjusted.

Preferably, a further variable gain circuit is connected between the first transducer and the filtering means. The further variable gain circuit may comprise a variable gain amplifier and an envelope detector whose input is connected to the output of the variable gain amplifier and whose output is connected to a gain control input of the variable gain amplifier. The variable gain amplifier and envelope detector may have an attack time of approximately 2 milliseconds and a release time of 100 milliseconds or more.

BRIEF DESCRIPTION OF THE DRAWINGS

The invention will be further described, by way of example, with reference to the accompanying drawings, in which.

DESCRIPTION OF THE PREFERRED EMBODIMENT

Figure 2:
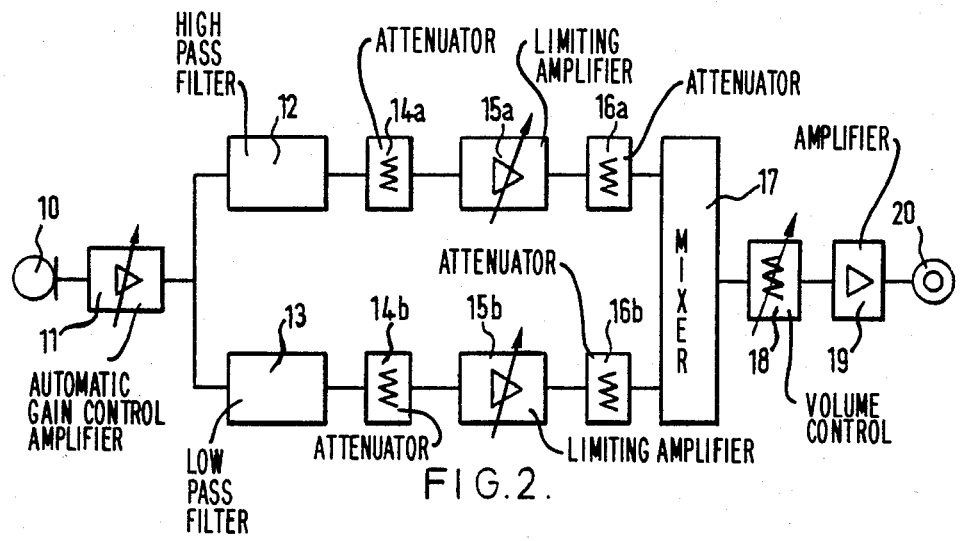
FIG. 2 is a block diagram of a hearing aid constituting a preferred embodiment of the invention.

The hearing aid shown in FIG. 2 comprises a microphone 10 connected to the input of an automatic gain control amplifier 11. The output of the automatic gain control 11 is connected to the input of a high pass filter 12 and a low pass filter 13. The filters 12 and 13 have a turnover frequency of 1500 Hz and have 'mirror image' filtering characteristics. The outputs of the filters 12 and 13 are supplied via attenuators 14a and 14b to the inputs of automatic gain control limiting amplifiers 15a and 15b respectively. The outputs of the amplifiers 15a and 15b are supplied via respective attenuators 16a and 16b to the inputs of a mixer 17. The output of the mixer is connected via a volume control 18 to the input of an amplifier 19, whose output drives an earphone 20.

In use, the microphone 10 converts sound into corresponding electrical signals which are supplied to the automatic gain control amplifier 11. The automatic gain control amplifier 11 provides compression of the dynamic range of the input signals across the whole frequency band thereof and supplies the compressed signal to the inputs of the filters 12 and 13. The filters 12 and 13 divide the frequency band of the compressed signal into signals of frequency above 1500 Hz and signals of frequency below 1500 Hz. The signals in these two frequency bands are then supplied via the respective attenuators to the automatic gain control limiting amplifiers 15a and 15b, each of which is arranged to amplify signals below a predetermined level with a substantially constant gain and, for signals above the predetermined level to provide an output signal of substantially constant level. The attentuators 14a and 14b allow the level of the signals supplied to the corresponding automatic gain control limiting amplifiers to be adjusted so as to allow the dynamic range limiting performed by the amplifiers to be preset according to the needs of the patient. The attenuators 16a and 16b can be used to adjust the relative levels of the two frequency bands according to the needs of the patient. Also, the volume control 18 allows the overall output level of the hearing aid to be adjusted according to the needs of the patient.

Figure 3:
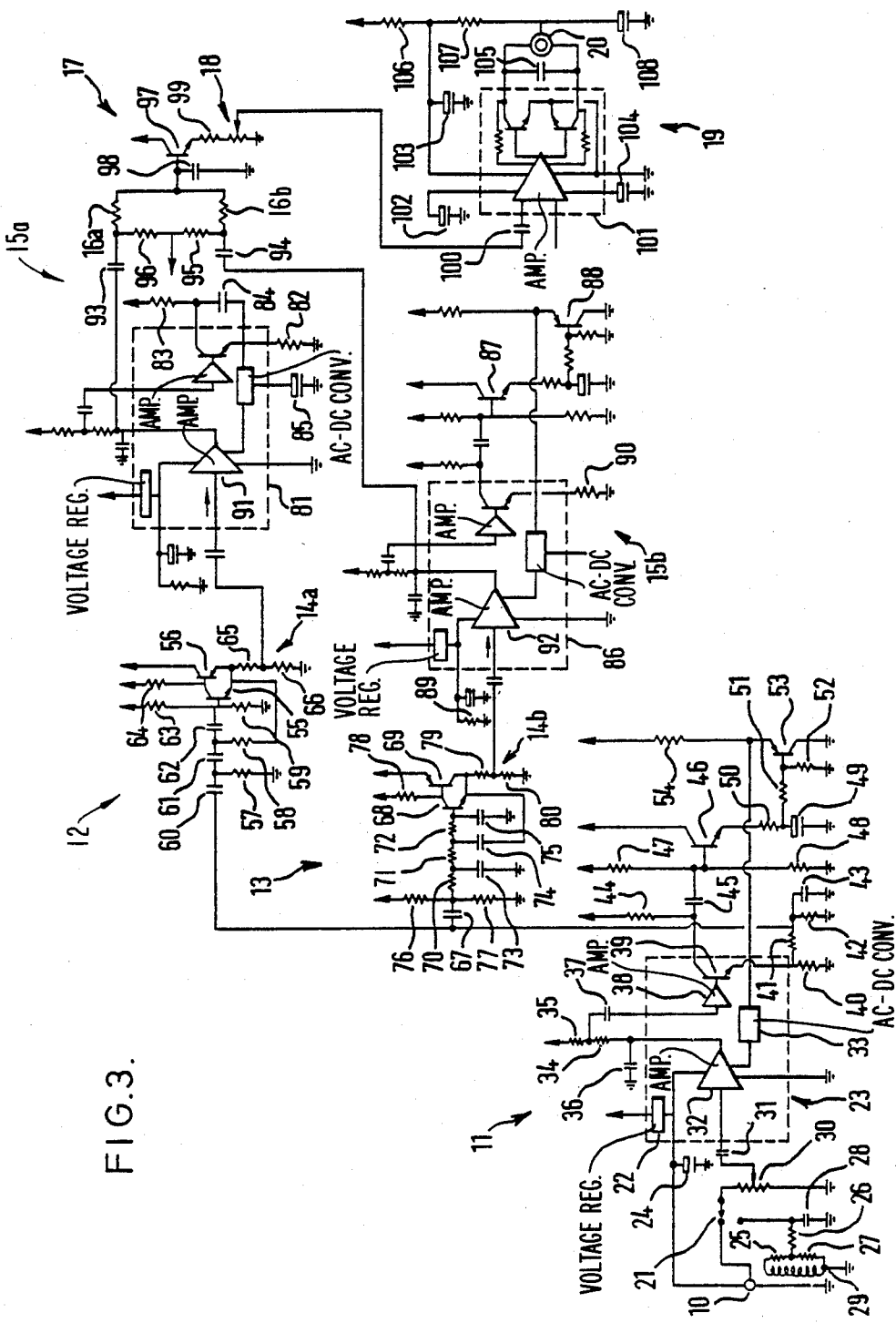
FIG. 3 is a circuit diagram of the hearing aid of FIG. 2.

FIG. 3 is a more detailed circuit diagram of the hearing aid of FIG. 2 with like parts being referred to by the same reference numerals. The microphone 10 is connected between a terminal of a changeover switch 21 and a common supply line, and also has an energisation terminal connected to a supply line from a voltage regulator 22 forming part of a first integrated circuit 23. The supply line is decoupled by a capacitor 24. The other fixed terminal of the switch 21 is connected via a network comprising resistors 25, 26, 27 and a capacitor 28 to a telephone coupler 29. The slider of the switch 21 is connected via an adjustable attenuators 30 and capacitor 31 to the input of a variable gain amplifier 32 also formed in the integrated circuit 23. The gain control input of the amplifier 32 is connected to the output of an AC-DC converter 33. The output of the amplifier 32 is connected via load resistors 34 and 35 to a positive supply line from a battery powering the hearing aid, and is also connected to the common line via a capacitor 36.

The signals from the amplifier 32 are coupled via a capacitor 37 to the input of a further amplifier 38 of the integrated circuit 23 having an output stage comprising an open emitter and open collector transistor 39. The emitter of the transistor 39 is provided with a load resistor 40 and supplies the output signals of the automatic gain control amplifier 11 via a network comprising resistors 41, 42 and a capacitor 43. The collector of the transistor 39 is provided with a load resistor 44 and is connected by a coupling capacitor 45 to the base of a transistor 46 provided with bias resistors 47 and 48. The transistor 46 is connected in the common-collector configuration, and its emitter is connected via a netowrk comprising a capacitor 49 and resistors 50, 51 and 52 to the base of another transistors 53 of complementary type to the transistor 46 and also connected in the same collector mode. The emitter of the transistor 53 is provided with a load resistor 54 and is also connected to the input of the AC-DC converter 33.

The high pass filter 12, which receives the output signals from the automatic gain control amplifier 11, is of the third order Sallen and Key type and comprises complementary transistors 55 and 56 connected as a compound emitter follower, filter resistors 57, 58, and 59, filter capacitors 60, 61, and 62, and bias resistors 63 and 64. The output load of the filter 12 comprises two resistors 65 and 66 which constitute the attenuator 14a.

The low pass filter 13, which receives the output signal from the automatic gain control amplifier 11 via a coupling capacitor 67, is also of the third order Sallen and Key type and comprises complementary transistors 68 and 69 connected as a compound emitter follower, filter resistors 70, 71, and 72, filter capacitors 73, 74, and 75, and bias resistors 76, 77, and 78. The attenuator 14b is formed by two load resistors 79 and 80 of the emitter follower.

The automatic gain control limiting amplifier 15a is based on an integrated circuit 81 of the same type as the integrated circuit 23. In fact, the amplifier 15a differs from the amplifier 11 only in that the transistors 46 and 53 and associated resistors and capacitors are replaced by an emitter resistor 82, a collector load resistor 83, a coupling capacitor 84, and a capacitor 85.

The automatic gain control limiting amplifier 15b comprises an integrated circuit 86 of the same type as the integrated circuit 23 together with transistors 87 and 88 and associated resistors and capacitors. In fact, the amplifier 15b differs from the amplifier 23 only in that the connection from the voltage regulator to the microphone 10 in the amplifier 11 is replaced by a connection to one end of a resistor 89 whose other end is connected to the common supply line, and in that the emitter network of the transistor 39 is replaced by a resistor 90. Further, the output signals from the limiting amplifier 15a and 15b are taken from the output of the amplifiers 91 and 92 instead of from the emitter of the transistor equivalent to the transistor 39.

The outputs of the limiting amplifiers 15a and 15b are connected via respective coupling networks comprising capacitors 93 and 94 and bias resistors 95 and 96, whose interconnection is connected to the output of the voltage regulator of the integrated circuit 81, and via the attenuators 16a and 16b to the input of the mixer 17. The mixer 17 comprises a transistor 97 connected in the common collector mode and provided with a base decoupling capacitor 98 and a emitter load comprising a resistor 99 and the attenuator 18 in the form of an adjustable potentiometer. The slider of the adjustable potentiometer is connected via a coupling capacitor 100 to the input of a micropower amplifier formed by a further integrated circuit 101 and provided with decoupling capacitors 102, 103, and 104. The amplifier 101 is arranged to provide push-pull output drive to the earphone 20, with a capacitor 105 connected across the outputs of the amplifier 101. An energisation input of the earphone 20 and the power supply input of the amplifier 101 are connected to the positive supply line via a decoupling network comprising resistors 106 and 107 and a capacitor 108.

The hearing aid shown in FIGS. 2 and 3 operates as follows. The switch 21 is used to select either the microphone 10 for normal use or the telephone coupler 29 when the patient wishes to use a telephone handset. The automatic gain control amplifier 11 compresses the dynamic range of the signals from the microphone or telephone or telephone coupler across the whole audio frequency band. In particular the output from the amplifier 38 in the integrated circuit 23 at the collector of the transistor 39 is supplied via the transistor 46, a filter comprising the resistors 50, 51, 52 and the capacitor 49, and the transistor 53 to the AC-DC converter 33, which detects the envelope of the output signal. The output signal from the converter 33 is arranged to have an attack time of approximately 2 milliseconds and a release time of approximately 100 milliseconds, and is supplied to the control input of the amplifier 32 so as to control the gain thereof to reduce the dynamic range of the input signals. However, the circuit which controls the gain of the amplifier 32 does not operate until the input signal exceeds a predetermined level, thus providing a delayed automatic gain control function. Accordingly, the attenuator 30 may be adjusted, according to the needs of the patient, so as to adjust the degree of compression i.e. the amount of the dynamic range of the input signal which is compressed.

The filters 12 and 13 divide the output signals from the amplifier 11 into two frequency bands with relatively little overlap at the cross over frequency. In the embodiments described, the cross over frequency is given as 1500 Hz, but could lie in the range from 1000 to 2000 Hz, the actual value being selected according to the needs of the patient. The outputs of the respective filters are supplied to the corresponding limiting amplifiers 15a and 15b. These amplifiers function in essentially the same way as the automatic gain control amplifier 11 except that the gain control circuits are arranged to have a higher gain so as to limit the output signals from these amplifiers when the input signals exceed a predetermined threshold, instead of merely reducing the dynamic range. Both the limiting amplifiers 15a and 15b have an attack time of approximately 2 milliseconds, whereas the release times may differ somewhat. For instance, the release time of the amplifier 15a may be approximately 10 milliseconds whereas the release time of the amplifier 15b may be approximately 30 milliseconds. Also the level of the signal at which limiting takes place may be adjusted by the attenuators 14a and 14b.

The outputs from the limiting amplifiers are supplied to the mixer 17 via the attenuators 16a and 16b. These attenuators comprise resistors whose values may be varied so as to alter the relative levels of the signals in the two frequency bands according to the needs of the patient. Also, the output level may be adjusted according to the needs of the patient by means of the volume control 18.

An advantage of the hearing aid shown in FIGS. 2 and 3 is that, with the cross over frequency of the filters 12 and 13 at approximately 1500 Hz, the limiting amplifier 15a reacts to consonants in speech whereas the amplifier 15b reacts to vowels in speech. As vowels in spoken language tend to be relatively louder than consonants, the two types of sounds are handled separately and the hearing aid is not prone to the masking effect which takes place with known hearing aids. For instance, such known hearing aids generally comprise a single dynamic range limiter covering the whole audio frequency band. Thus, when a consonant follows a vowel, the dynamic range will be greatly compressed because of the relatively high sound level of the vowel. However, the known system cannot recover sufficiently quickly to restore the dynamic range for the following consonant, whose level is therefore reduced relative to that of the vowel, thus making speech much less intelligible.

FIGS. 4(a) to (d) illustrate graphically four types of possible hearing impairment, in which sound intensity is plotted against frequency, $T_d$ and $T_H$ are the thresholds of discomfort and hearing, respectively, and $D_L$ and $D_H$ are the dynamic range at low and high frequencies, respectively.

Figure 4A:
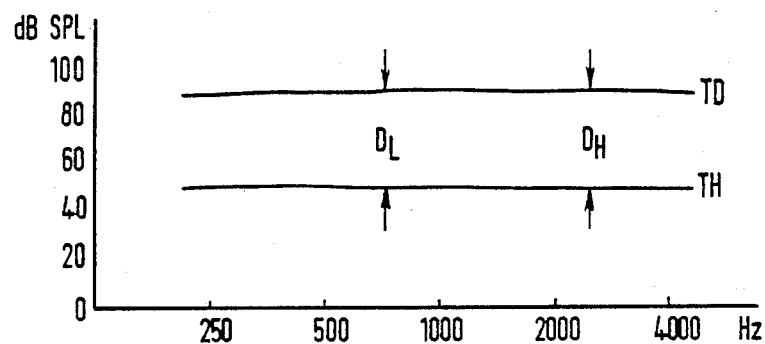
FIGS. 4(a) to (d) illustrate graphically four types of hearing impairment.

FIG. 4(a) illustrate flat hearing loss, in which the patient's threshold of hearing is raised by the same amount throughout the frequency spectrum.

Figure 4B:
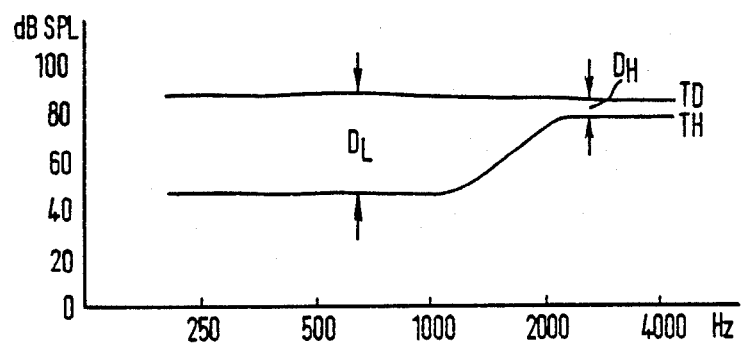

FIG. 4(b) illustrates high frequency loss, in which the patient's threshold of hearing is raised more at high frequencies than at low frequencies.

Figure 4C:
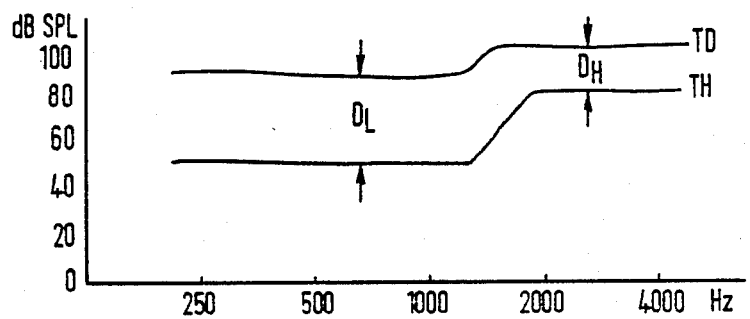

In FIG. 4(c), high frequency loss is accompanied by an increase in the patient's threshold of discomfort at high frequencies.

Figure 4D:
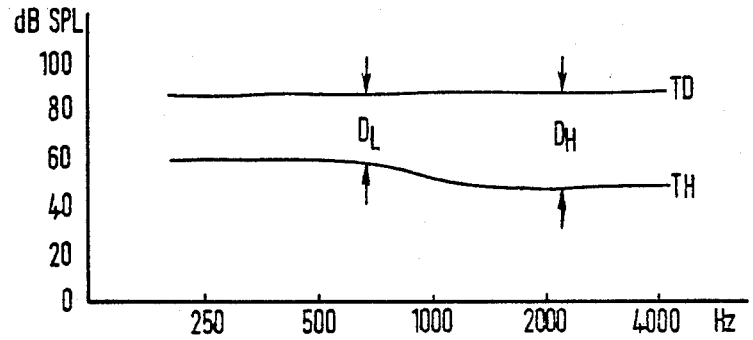

FIG. 4(d) illustrates low frequency loss, in which the patient's threshold of hearing is raised more at low frequencies than at high frequencies.

An example of the calculation of parameters of a hearing aid will be given with reference to FIG. 2.

Figure 1:
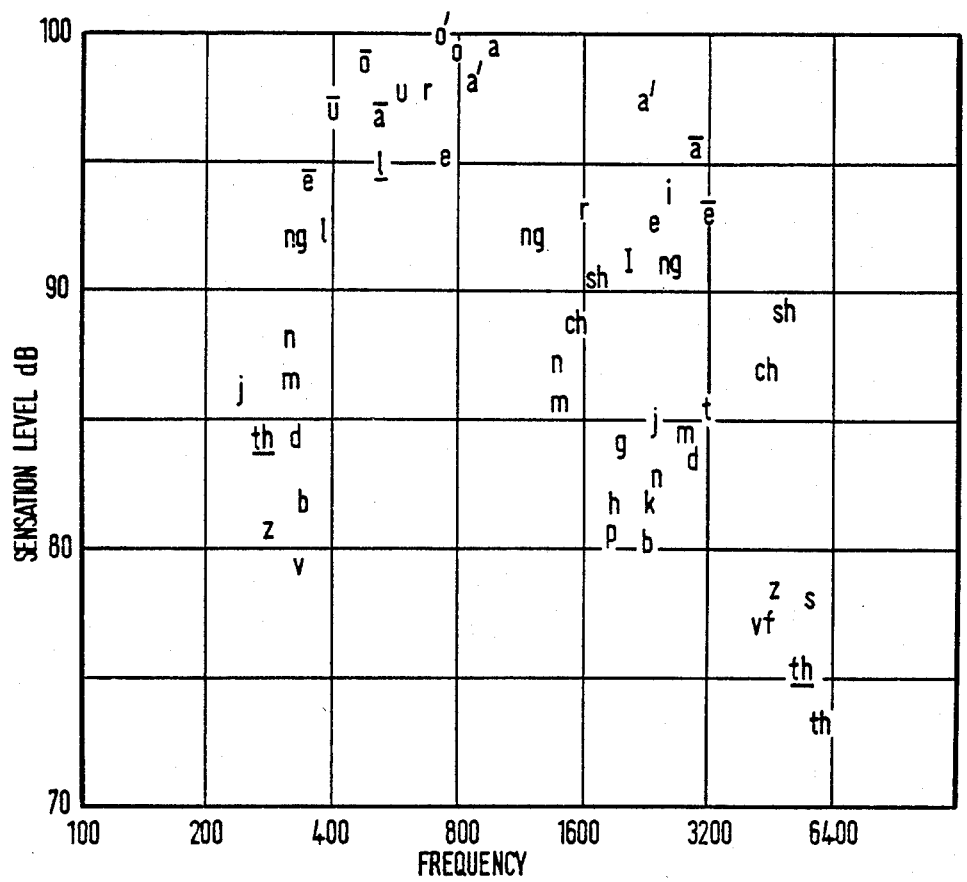
FIG. 1 is a graph illustrating the sound intensity against frequency of various speed sounds.

The dynamic range of speech normally encountered is from 55 dB SPL peak to 85 dB SPL peak. The AGC threshold of the amplifier 11 is set at 65 dB SPL and the speech signal at the output of amplifier 11 is 0 dB at 750 Hz for 65 dB SPL input. With reference to FIG. 1 and assuming the losses due to filters 12 and 13 are zero in the pass bands, the range of peak speech signals in the high channel will be −5 dB to −15 dB and in the low channel will be 0 dB to −10 dB. Let the AGC threshold for amplifiers 15a and 15b occur at TdB referred to the input.

Suppose the patient has a flat threshold of discomfort and a dynamic range at 2500 Hz of $D_H$ and a dynamic range at 750 Hz $D_L$ (FIG. 4).

The threshold T corresponds to the threshold of discomfort. The minimum HF signal heard by the patient will correspond to $T-D_H$ dB. The minimum LF signal heard will correspond to $T-D_L$ dB.

The minimum HF signal applied to the HF attenuator is −35 dB. So $-35\ dB - L_H = T - D_H$. Hence $-L_H = T - D_H + 35$ dB. Similarly $-L_L = T - D_L + 30$ dB.

If the threshold of discomfort is flat, the losses of the attenuators 16a and 16b are made the same. (FIG. 4(a)).

If the threshold of discomfort at high frequencies is greater than that at low frequencies by 10 dB, then the loss $M_H$ is made 10 dB smaller than the loss $M_L$ (FIG. 4(c)). The actual maximum power output of the aid, which corresponds to the actual value of the threshold of discomfort in dB SPL is set by volume control 18 to suit the patient.

What I claim is:

1. A hearing aid, comprising; a first electro-acoustic transducer for converting sound to an electrical signal;

frequency dependent filtering means comprising a high pass filter and a low pass filter for dividing the electrical signal from said first transducer into two signals of different frequency bands; a high pass channel and a low pass channel comprising respective variable gain circuits arranged to reduce the dynamic range of the signals from said high pass filter and said low pass filter, respectively said filters having substantially the same turnover frequency, in the range 1000 to 2000 Hz; means for mixing the outputs of the channels; and a second electroacoustic transducer for converting the output of said mixing means to an acoustic signal; each of said variable gain circuits being arranged to provide constant gain amplification for the signals from said respective filter below a predetermined threshold and, for signals above said predetermined threshold, to provide a peak output which is substantially constant without distorting said signals.

2. A hearing aid as claimed in claim 1, wherein each variable gain circuit comprises a variable gain amplifier and an envelope detector whose input is connected to the output of the variable gain amplifier and whose output is connected to a gain control input of the variable gain amplifier.

3. A hearing aid as claimed in claim 1, wherein each of said variable gain circuits has an attack time substantially equal to the two milliseconds.

4. A hearing aid as claimed in claim 1, wherein the variable gain circuit has a release time in the range of 10 to 30 milliseconds in the high pass channel and the variable gain circuit in said low pass channel has a release time in the range 30 to 100 milliseconds.

5. A hearing aid as claimed in claim 1, wherein the turnover frequency is substantially 1500 Hz.

6. A hearing aid as claimed in claim 2, wherein an adjustable attenuator is provided between the input of each variable gain amplifier and the output of the corresponding filter.

7. A hearing aid as claimed in claim 2, wherein an adjustable attenuator is provided between the output of each variable gain amplifier and the mixing means.

8. A hearing aid as claimed in claim 1, wherein a further dynamic range reducing variable gain circuit is connected between the first transducer and the filtering means.

9. A hearing aid as claimed in claim 8, wherein the further dynamic range reducing variable gain circuit comprises a variable gain amplifier and an envelope detector whose input is connected to the output of the variable gain amplifier and whose output is connected to a gain control input of the variable gain amplifier.

10. A hearing aid as claimed in claim 8, wherein the further variable gain circuit has an attack time substantially equal to 2 milliseconds and a release time of at least 100 milliseconds.

* * * * *